(12) United States Patent
Wu

(10) Patent No.: US 7,402,760 B2
(45) Date of Patent: Jul. 22, 2008

(54) MULTI-LAYER PRINTED WIRING BOARD AND MANUFACTURING METHOD THEREOF

(75) Inventor: Youhong Wu, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 11/832,892

(22) Filed: Aug. 2, 2007

(65) Prior Publication Data

US 2008/0060840 A1    Mar. 13, 2008

Related U.S. Application Data

(63) Continuation of application No. PCT/JP2006/001453, filed on Jan. 30, 2006.

(51) Int. Cl.
    *H05K 1/11*    (2006.01)
(52) U.S. Cl. ................ 174/265; 174/262; 361/790; 361/792; 361/795
(58) Field of Classification Search ............. 174/265, 174/262
    See application file for complete search history.

(56) References Cited

U.S. PATENT DOCUMENTS

| | | | | |
|---|---|---|---|---|
| 5,590,461 A | * | 1/1997 | Ishida | 29/830 |
| 5,713,127 A | * | 2/1998 | Chobot et al. | 29/852 |
| 5,758,413 A | * | 6/1998 | Chong et al. | 29/852 |
| 5,875,102 A | * | 2/1999 | Barrow | 361/777 |
| 6,078,013 A | * | 6/2000 | Stack | 174/262 |
| 6,487,088 B2 | * | 11/2002 | Asai et al. | 361/794 |
| 6,591,491 B2 | * | 7/2003 | Fujii et al. | 29/830 |
| 7,091,424 B2 | * | 8/2006 | Oggioni et al. | 174/262 |

(Continued)

FOREIGN PATENT DOCUMENTS

JP    2001-044640    2/2001

(Continued)

OTHER PUBLICATIONS

U.S. Appl. No. 11/832,892, filed Aug. 2, 2007, Wu.
U.S. Appl. No. 11/832,673, filed Aug. 2, 2007, Wu.

*Primary Examiner*—Dean A. Reichard
*Assistant Examiner*—Hoa C Nguyen
(74) *Attorney, Agent, or Firm*—Oblon, Spivak, McClelland, Maier & Neustadt, P.C.

(57) ABSTRACT

A multi-layer printed wiring board has a core substrate, a throughhole structure, a first interlayer insulation layer, a first via, a second interlayer insulation layer and a second via. The core substrate has a throughhole opening, and the throughhole structure is formed in the throughhole opening. The first interlayer insulation layer is formed over the core substrate. The first via is formed in the first interlayer insulation layer and has a bottom portion having a first radius. The second interlayer insulation layer is formed over the first interlayer insulation layer and the first via. The second via is formed in the second interlayer insulation layer and has a bottom portion having a second radius greater than the first radius. The first via is positioned inside a circle having a radius (D1) from a gravity center of the throughhole opening, and the radius (D1) of the circle satisfies a formula, $(D1)=(R)+(r)/3$, where (R) represents a radius of the throughhole opening and (r) represents the first radius of the first via.

24 Claims, 9 Drawing Sheets

U.S. PATENT DOCUMENTS

| | | | |
|---|---|---|---|
| 7,102,085 B2 * | 9/2006 | Ohta et al. | 174/260 |
| 7,262,975 B2 * | 8/2007 | Kariya et al. | 361/795 |
| 7,339,118 B1 * | 3/2008 | Takada et al. | 174/255 |
| 2005/0126818 A1 * | 6/2005 | Kojima et al. | 174/255 |
| 2005/0236177 A1 * | 10/2005 | Inagaki et al. | 174/255 |
| 2006/0231290 A1 * | 10/2006 | Kariya et al. | 174/258 |
| 2007/0151758 A1 * | 7/2007 | Dunn et al. | 174/262 |
| 2008/0055872 A1 * | 3/2008 | Inagaki et al. | 361/760 |

FOREIGN PATENT DOCUMENTS

| | | |
|---|---|---|
| JP | 2001-127435 | 5/2001 |
| JP | 2002-094240 | 3/2002 |
| JP | 2002-208778 | 7/2002 |
| JP | 2003-152311 | 5/2003 |

* cited by examiner

FIG. 4
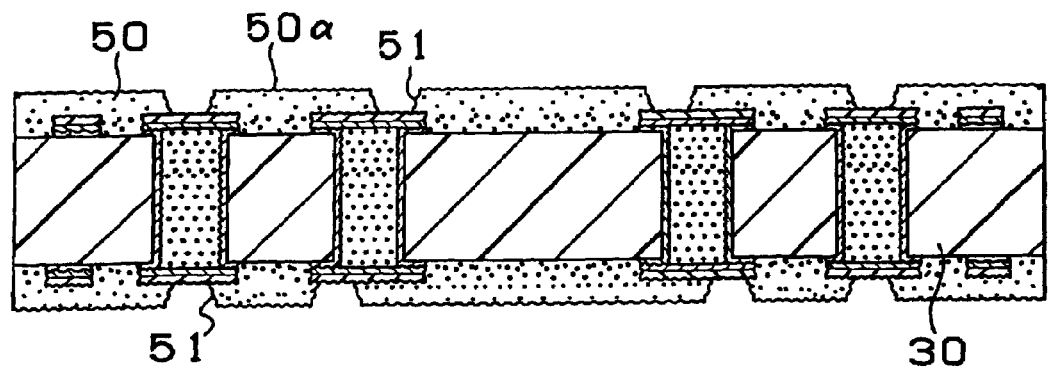
(A)
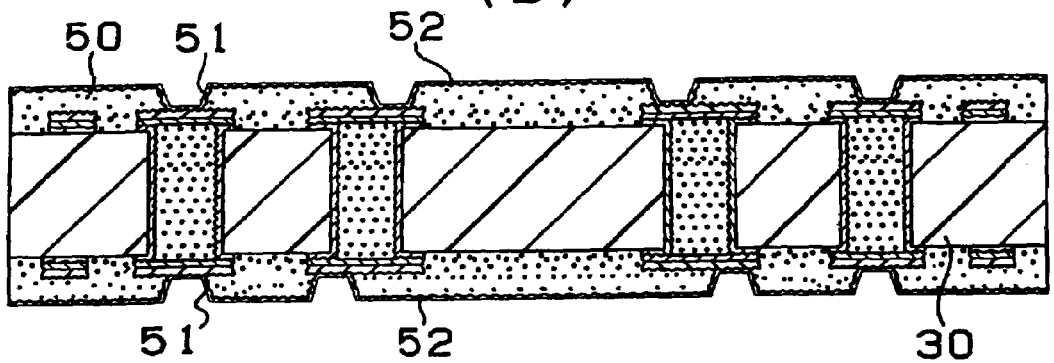
(B)
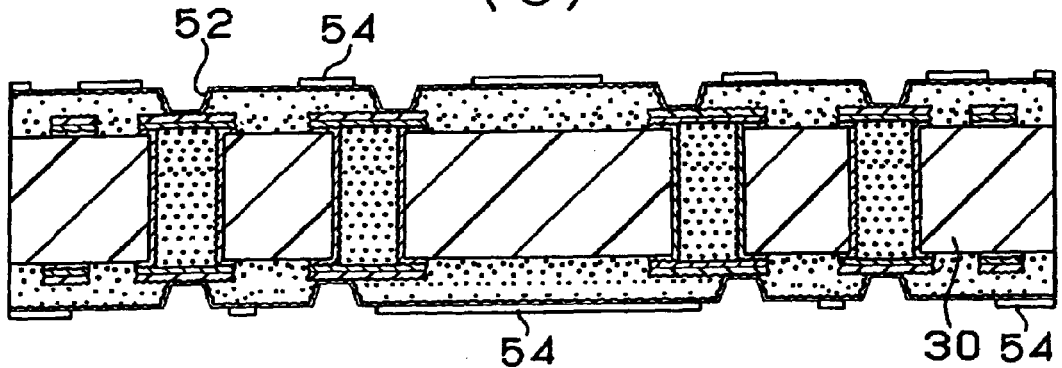
(C)

FIG. 6
(A)
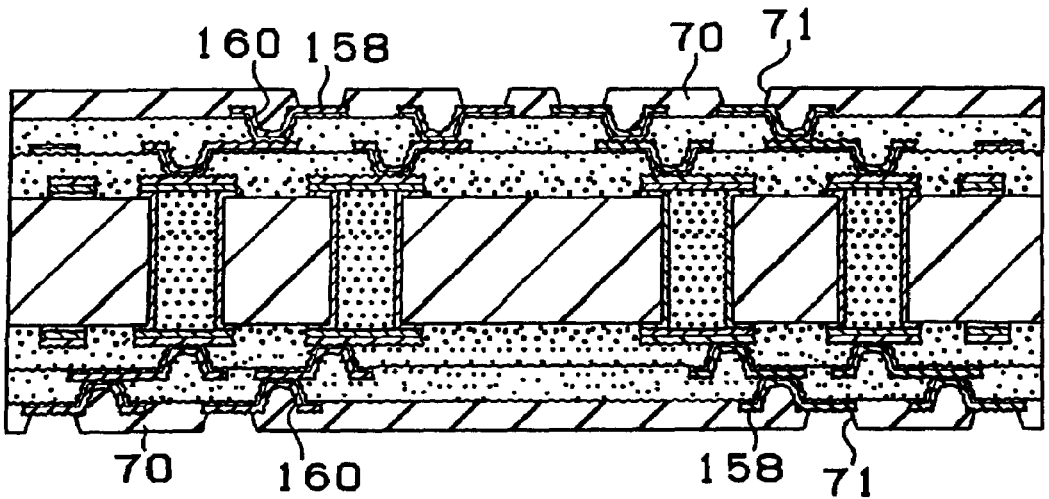
(B)
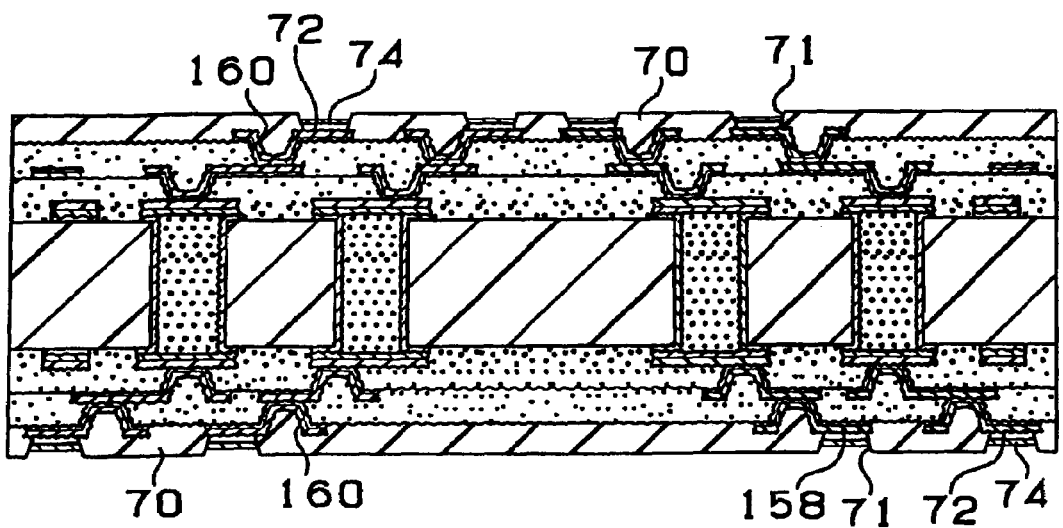

MULTI-LAYER PRINTED WIRING BOARD AND MANUFACTURING METHOD THEREOF

CROSS-REFERENCE TO RELATED APPLICATIONS

The present application is a continuation of a PCT application, PCT/JP2006/301453, filed Jan. 30, 2006, which claims the benefit of priority to Japanese Patent Application No. 2005-026896, filed Feb. 2, 2005. The contents of these applications are incorporated herein by reference in their entirety.

BACKGROUND OF THE INVENTION

1. Field of the Invention

The present invention relates to a multi-layer printed wiring board and a method of manufacturing the multi-layer printed wiring board.

2. Discussion of the Background

Japanese Unexamined Patent Publication No. 2002-208778 describes a buildup multi-layer printed wiring board having a core substrate and inter-layer insulation resin layers formed on top and bottom surfaces of the core substrate. This printed wiring board has a throughhole structure having an outer throughhole structure and an inner throughhole structure. The outer throughhole structure has a metal film formed on a wall of a throughhole, and a resin filler is formed in the metal film. The inner throughhole structure is provided in the resin filler and has a metal layer, an electroless plating film and an electrolytic plating film. The contents of this publication are incorporated herein by reference in their entirety.

SUMMARY OF THE INVENTION

According to one aspect of the present invention, a multi-layer printed wiring board has a core substrate, a throughhole structure, a first interlayer insulation layer, a first via, a second interlayer insulation layer and a second via. The core substrate has a throughhole opening, and the throughhole structure is formed in the throughhole opening. The first interlayer insulation layer is formed over the core substrate. The first via is formed in the first interlayer insulation layer and has a bottom portion having a first radius. The second interlayer insulation layer is formed over the first interlayer insulation layer and the first via. The second via is formed in the second interlayer insulation layer and has a bottom portion having a second radius greater than the first radius. The first via is positioned inside a circle having a radius (D1) from a gravity center of the throughhole opening, and the radius (D1) of the circle satisfies a formula, (D1)=(R)+(r)/3, where (R) represents a radius of the throughhole opening and (r) represents the first radius of the first via.

According to another aspect of the present invention, in a method of manufacturing a multi-layer printed wiring board, a throughhole opening is formed in a core substrate, a throughhole structure is formed in the throughhole opening, a first interlayer insulation layer is formed over the core substrate, a first via is formed in the first interlayer insulation layer, a second interlayer insulation layer is formed over the first interlayer insulation layer, and a second via is formed in the second interlayer insulation layer. The first via has a bottom portion having a first radius, and the second via has a bottom portion having a second radius greater than the first radius. The first via is formed inside a circle having a radius (D1) from a gravity center of the throughhole opening, and the radius (D1) of the circle satisfies a formula, (D1)=(R)+(r)/3, where (R) represents a radius of the throughhole opening and (r) represents the first radius of the first via.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(C) are cross-sectional views of the multi-layer printed wiring board during the manufacturing process;

FIGS. 6(A) and 6(B) are cross-sectional views of the multi-layer printed wiring board during the manufacturing process;

DESCRIPTION OF THE EMBODIMENTS

Figure 1:
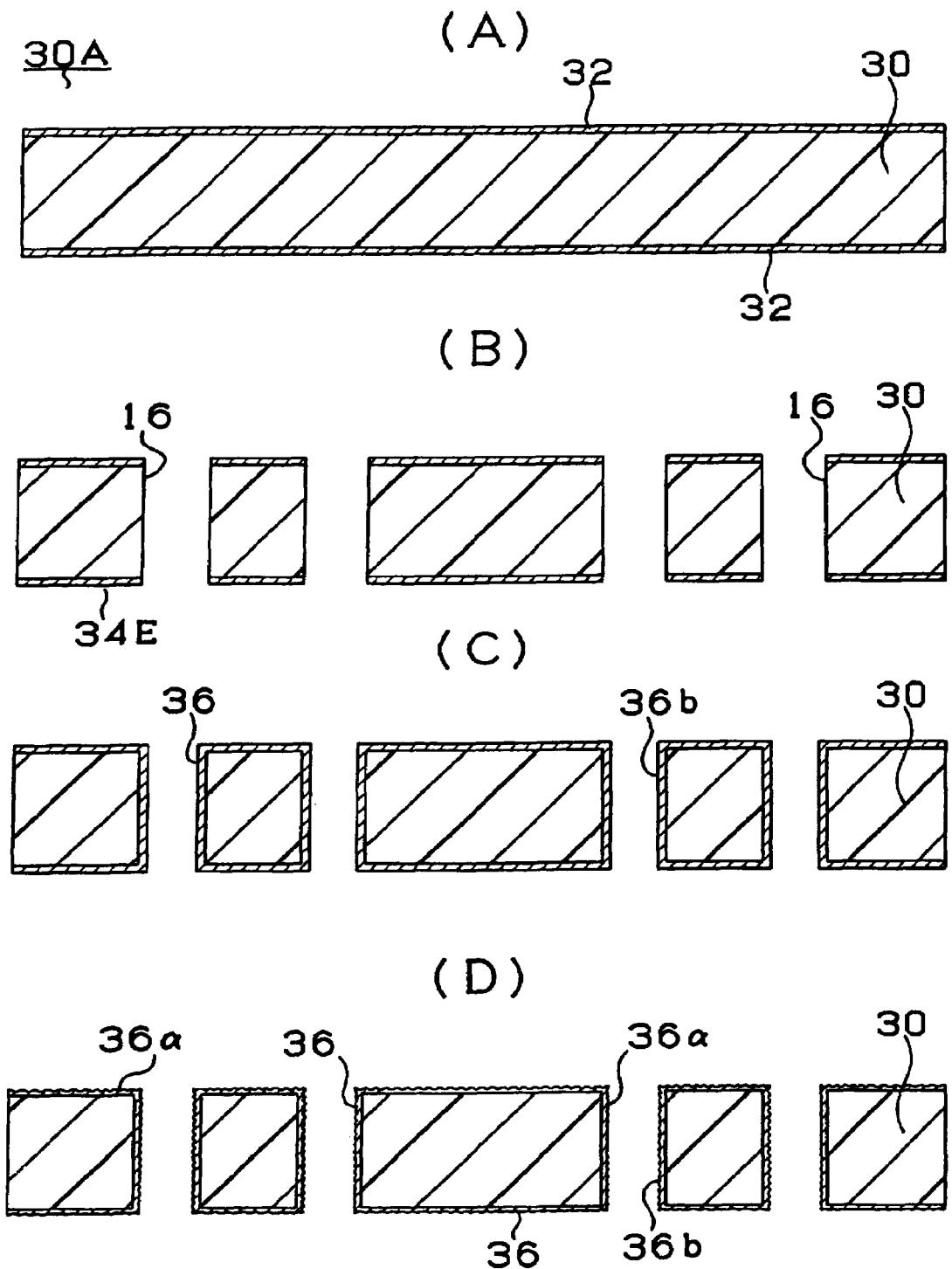
FIGS. 1(A)-1(D) are cross-sectional views of a multi-layer printed wiring board during a manufacturing process according to one embodiment of the present invention.
Figure 2:
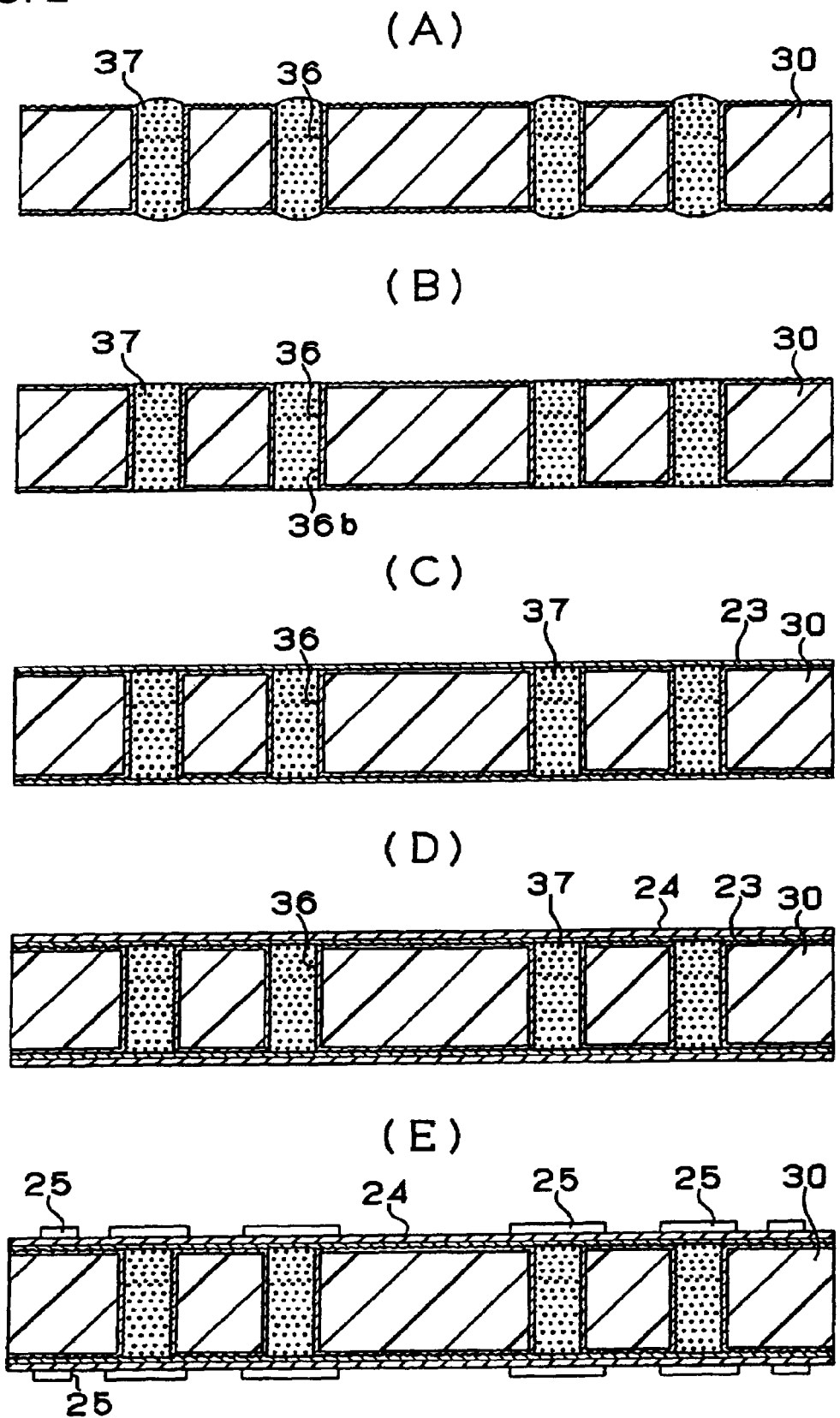
FIGS. 2(A)-2(E) are cross-sectional views of the multi-layer printed wiring board during the manufacturing process.

The embodiments will now be described with reference to the accompanying drawings, wherein like reference numerals designate corresponding or identical elements throughout the various drawings.

Figure 7:
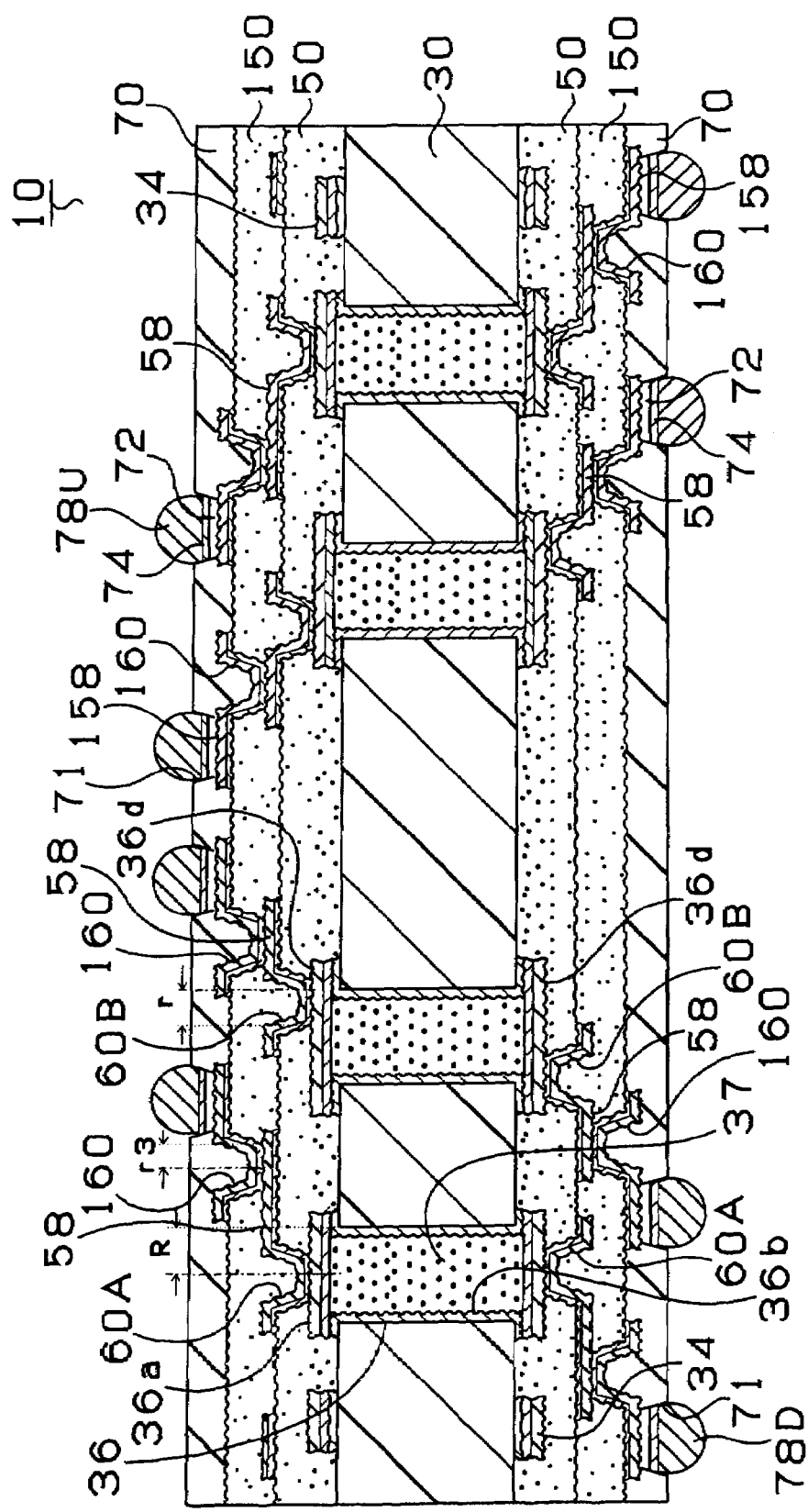
FIG. 7 is a cross-sectional view of a multi-layer printed wiring board according to one embodiment of the present invention.

FIG. 7 is a cross-sectional view of a multi-layer printed wiring board according to one embodiment of the present invention. Referring to FIG. 7, a multi-layer printed wiring board 10 has a core substrate 30, first interlayer insulation layers 50 formed on the core substrate 30, a conductor circuit 34 formed above the core substrate 30, and second interlayer insulation layers 150 formed on the first interlayer insulation layers 50. The front and rear surfaces of the core substrate 30 are connected with each other by a throughhole structure 36. The throughhole structure 36 has a sidewall conductor layer (36b) and cover plated layers (throughhole lands) (36a), (36d) and is filled with a filler 37. The first interlayer insulation layer 50 has first vias (60A), (60B) and a conductor circuit 58, and the second interlayer insulation layer 150 has second vias 160 and a conductor circuit 158. A resist layer 70 is formed above the second via 160 and conductor circuit 158 and has openings 71 where plating layers 72, 74 are formed, and bumps (78U), (78D) are provided on the plating layer 74. As shown in FIG. 7, the bottom of the first via (60A) has a radius (r), the bottom of the second via 160 has a radius (r3), and a throughhole opening 16 has a radius (R). The first via (60A) is positioned inside a circle having a radius ((R)+(r)/3) from the center of gravity of the throughhole opening 16, and the bottom radius (r) of the first via (60A) is made smaller than the bottom radius (r3) of the second via 160. As such, the multi-layer printed wiring board 10 achieves higher connection reliability and higher integration degree by using vias of smaller diameters.

Figure 8:
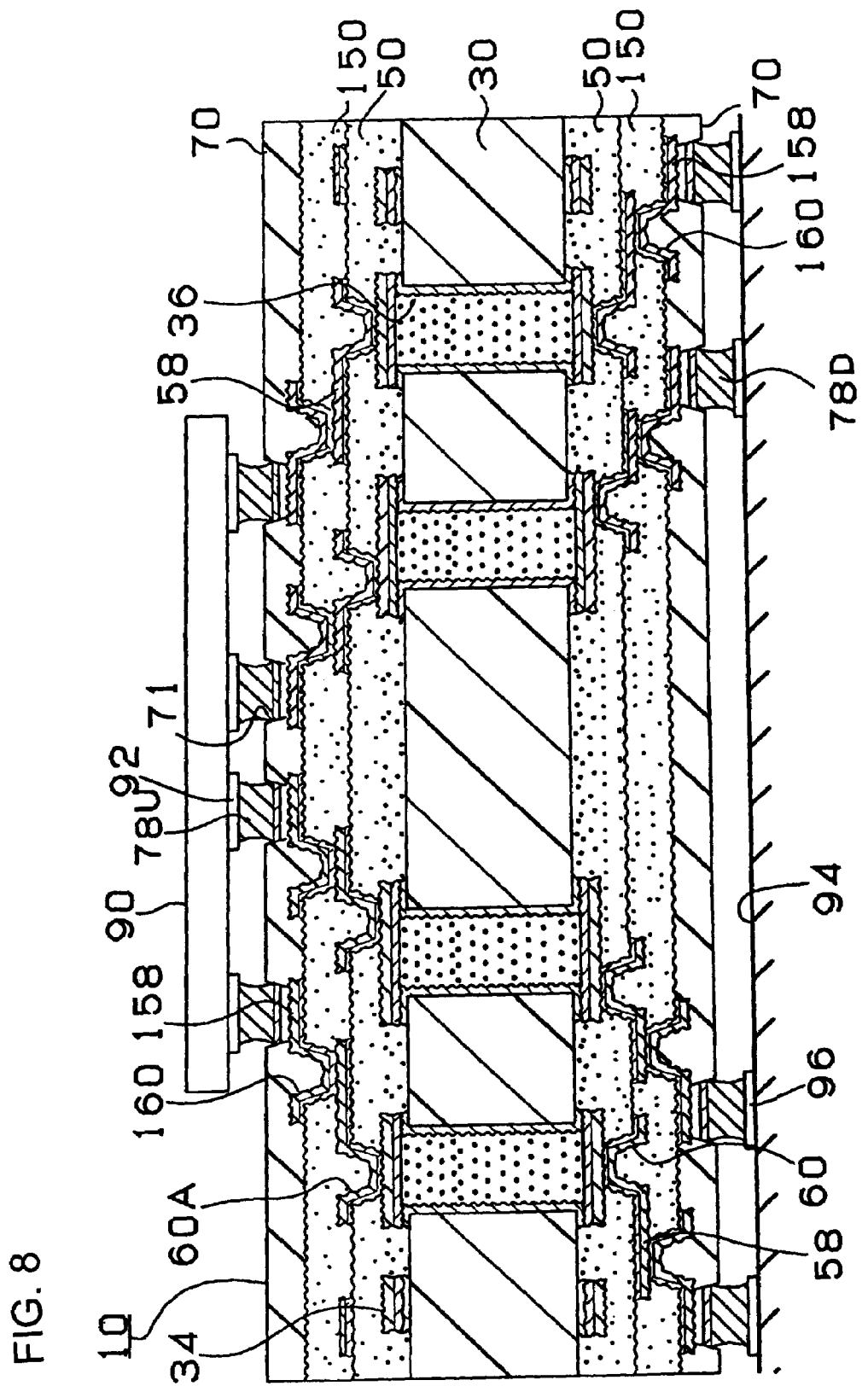
FIG. 8 is a cross-sectional view of a multi-layer printed wiring board according to one embodiment of the present invention with a mounted IC chip.

FIG. 8 is a cross-sectional view of the multi-layer printed wiring board 10 with a mounted IC chip. Referring to FIG. 8, an IC chip 90 is mounted on the multi-layer printed wiring board 10 and the multi-layer printed wiring board 10 is placed on a daughterboard 94. The bump (78U) provided on the front side of the multi-layer printed wiring board 10 is connected to a land 92 of the IC chip 90, while the bump (78D) provided on the rear side is connected to a land 96 of the daughterboard 94.

FIGS. 9(A)-9(E) are plan views of cover plated layers (36a) and (36d) provided in the multi-layer printed wiring board 10. FIG. 9(A) is a plan view of a cover plated layer (throughhole land) (36a). This cover plated layer (36a) has a substantially circular shape, and the bottom portion of the first via (60A) formed above the cover plated layer (36a) is positioned inside a circle having a radius ((R)+(r)/3) from the center of gravity (36g) of the throughhole opening 16 where the radius of the throughhole opening 16 is (R), and the bottom radius of the first via (60A) is (r), and the center of gravity of the first via (60A) is (60g). For example, the throughhole opening 16 may be made to 0.08 mm-0.25 mm in size with a drill to have a radius (R) of 50 μm, the bottom of the first via (60A) provided on the cover plated layer (36a) may have a radius (r) of 22.5 μm, and the bottom of the second via 160 formed in the second interlayer insulation layer 150 above the first via (60A) may have a radius (r3) of 25 μm.

FIG. 9(B) is a plan view of a cover plated layer (throughhole land) (36d). This cover plated layer (36d) is snowman-shaped (i.e., two semicircles are combined). Like the first via (60A), the bottom of the first via (60B) on the cover plated layer (36d) is formed inside a circle having a radius ((R)+(r)/3) from the center of gravity (36g) of the throughhole opening 16.

Figure 9:
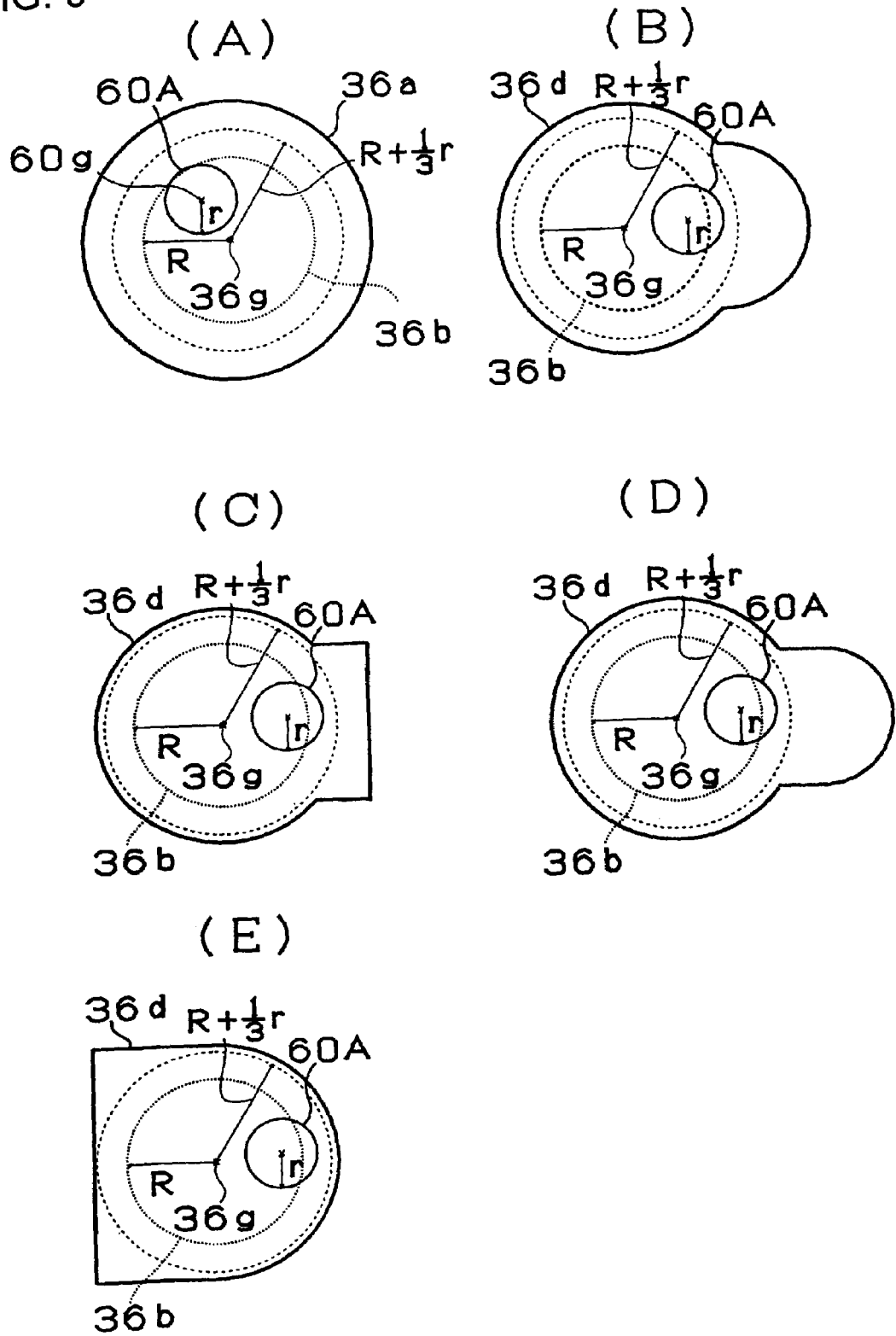
FIGS. 9(A)-9(E) are plan views of cover plated layers provided in a multi-layer printed wiring board according to one embodiment of the present invention.

FIGS. 9(C), 9(D), and 9(E) show other exemplary shapes of the cover plated layer (throughhole land) (36d) and the position of the first via (60B). As illustrated, the cover plated layer (36d) may have a shape other than the snowman-shape. In the case of FIG. 9 (E), the cover plated layer (36d) has a protruding portion over which the first via (60B) is formed, and thus the throughhole pitches may be made more narrow-pitched, and more densification is achieved. In the case that a via hole is not a circle but an oval or a polygon, the numeral (r) is ½ of the length of a line connecting both ends (two farthest points) of outer circumference. This is also true for a throughhole. The numeral (r) is ½ of the longitudinal diameter of an oval and ½ of the diagonal line of a rectangle.

As discussed above, in the present embodiment, the bottom radius (r) of the first via (60A) which is formed on the cover-like conductor layer (cover plated layer) (36a) and has a bottom portion placed inside a circle of a radius ((R)+(r)/3) from the center of gravity of the throughhole opening 16 is made smaller than the bottom radius (r3) of the second via 160 formed in the second interlayer insulation layer 150. Therefore, higher connection reliability is achieved, and also the integration degree is increased by using a via hole of the minimum radius in each region. This structure is based on the findings in a simulation study that a first via (60A) which is formed on a cover-like conductor layer (cover plated layer) (36a) and has a bottom portion largely formed over a throughhole opening 16 receives a smaller stress during a heat cycle, as compared with a via hole (second via 160) formed in the second interlayer insulation layer 150.

More specifically, the simulation study examined the stress applied during a heat cycle to the first vias (60A), (60B) on the cover plated layers (36a), (36d) and the second vias 160 formed above those first vias (60A), (60B). In this study, 3D thermal stress simulation with a finite element method (FEM) was conducted. If the structure under analysis contains material that is marked in plasticity and creep characteristic such as solder, non-linear thermal stress simulation is more suitable, taking the plasticity and creep characteristic into consideration. Therefore, thermal stress during thermal impact tests on micro vias of a high-density and multi-layer organic package was analyzed with a multi-scaling (sub-modeling) method. Specifically, a model including the entire substrate was analyzed with a coarse mesh, a variation calculated based on the analysis was used as a boundary condition of a sub-model divided by a minute mesh, and the sections of interest were carefully analyzed. In other words, a coarse model of a package was analyzed, variation was set as a boundary condition of a sub-model, and a non-linear thermal stress analysis was conducted under the conditions of thermal impact tests (−55° C.~125° C.), taking the plasticity of solder into consideration.

As a result, it was found that stress of 35 MPa was applied to the first via (60A) or (60B) which was formed on the cover plated layer (36a) or (36d) and had a bottom portion placed inside a circle of a radius ((R)+(r)/3) as described above, while stress of 90 MPa was applied to the second via 160 formed in the second interlayer insulation layer 150. In other words, the stress applied during a heat cycle to the first via (60A) or (60B) which is formed on the cover-like conductor layer (cover plated layer) (36a) or (36d) and has a bottom portion placed inside a circle having a radius ((R)+(r)/3) from the center of gravity (36g) of the throughhole opening 16 is smaller than the stress applied to the second via 160 formed in the second interlayer insulation layer 150.

It is advantageous to apply the present embodiment to multi-layer printed wiring boards where the bottom radius of a second via 160 is 30 μm or less, the radius of the throughhole opening is 100 μm or less, and the throughhole pitch is 385 μm or less. This is because a printed wiring board may be liable to warp by environmental changes when the core has throughholes of a smaller radius positioned in a narrower pitch, and stress may tend to be concentrated on the second via.

FIGS. 1(A)-6(B) are cross-sectional views of a multi-layer printed wiring board during a manufacturing process according to one embodiment of the present invention. Referring to FIGS. 1(A)-6(B), a method of producing the multi-layer printed wiring board is discussed below.

(1) As shown in FIG. 1(A), a laminated plate (30A) is formed by laminating a metal film 32 on front and rear surfaces of a core substrate 30. For example, the laminated plate (30A) may be a copper clad laminated plate formed by laminating copper foils of 5~250 μm on the surfaces of an insulative substrate of 0.2~0.8 mm in thickness made of glass epoxy resin or BT (Bismaleimide-Triazine) resin. As illustrated in FIG. 1(B), the laminated plate (30A) is drilled to make throughhole openings 16. Then, as shown in FIG. 1(C), electroless plating and electrolytic plating are carried out to form the sidewall conductor layer (36b) of the throughhole conductor 36. For instance, the throughhole opening 16 may be set to 0.1~0.25 mm Ø with a drill, and the pitch of the throughhole openings 16 may be set to 0.15~0.575 mm.

(2) After the core substrate 30 having the throughhole conductor 36 is washed with water and dried, the entire exposed surface of the metal film 32 including the sidewall conductor layer (36b) is roughened to form coarse surfaces (36a) as illustrated in FIG. 1(D). For example, the coarse surfaces (36α) may be formed by black oxide treatment using as black oxidizing solution (oxidizing bath) an aqueous solution containing NaOH (10 g/L), NaClO$_2$ (40 g/L), Na$_3$PO$_4$ (6 g/L) and by reduction treatment using as reduction bath an aqueous solution containing NaOH (10 g/L) and NaBH$_4$ (6 g/L).

(3) Next, as shown in FIG. 2(A), the throughhole conductor 36 is filled with a filler 37 by using, for example, a screen printing method and then dried and solidified. One example of the filler 37 is non-conductive copper filling paste (made by Tatsuta Electric Wire & Cable Co., Ltd.; brand name, DD paste) containing copper particles of 10 μm in average diameter. The throughhole conductor 36 may be filled with the filler 37 by applying filler material to the core substrate 30 having masks with openings at throughhole portions by using a printing method, and subsequently drying and solidifying the filler material. Then, the filler 37 that sticks out from the throughhole conductor 36 is removed by, for instance, belt sander grinding using #600 belt polishing paper (made by Sankyo Rikagaku Co., Ltd.). Buffing for removing scratches caused by the belt sander grinding is conducted to smooth out the surfaces of the core substrate 30 as illustrated in FIG. 2(B). The core substrate 30 thus formed has the throughhole conductor 36 having the sidewall conductor layer (36*b*) and the filler 37 tightly attached to each other through the coarse surfaces (36α). Instead of using the filler as discussed above, the throughhole conductor 37 may be filled with the same material (such as copper) as the sidewall conductor layer (36*b*).

(4) A catalyst, for example, palladium catalyst (made by Atotec Japan Co., Ltd.) is applied to the surface of the core substrate 30 that has been smoothed out in the above process (3). Then, as shown in FIG. 2(C), the core substrate 30 is subjected to electroless plating to form an electroless plating film 23. The electroless plating may be electroless copper plating to form an electroless copper plating film of 0.6 μm in thickness.

(5) In the process of FIG. 2(D), electrolytic plating is carried out to form an electrolytic plating film 24 which becomes the conductor circuit 34 and the cover plated layers (throughhole lands) (36*a*) and (36*d*) covering the filler 37 of the throughhole conductor 36. As an example, electrolytic copper plating may be carried out under the conditions as shown below to form an electrolytic copper plating film of 15 μm in thickness.

| [Aqueous electrolytic plating solution] | |
|---|---|
| Sulfuric acid | 180 g/L |
| Copper sulfate | 80 g/L |
| Additive (made by Atotec Japan; brand name, Caparasid GL) | 1 mL/L |
| [Electrolytic plating conditions] | |
| Current density | 1 A/dm$^2$ |
| Time | 30 minutes |
| Temperature | room temperature |

(6) In the process of FIG. 2(E), an etching resist 25 is formed on selected portions of the electrolytic plating film 24 formed on both surfaces of the core substrate 30. For instance, the etching resist 25 may be formed as follows: a commercially available photosensitive dry film is attached to the electrolytic plating film 24, a mask is placed thereon, the core substrate 30 is exposed to light (100 mJ/cm$^2$) and developed with 0.8% sodium carbonate to form an etching resist of 15 μm in thickness. The shape of the cover plated layer can be changed by varying the pattern of a mask.

Figure 3:
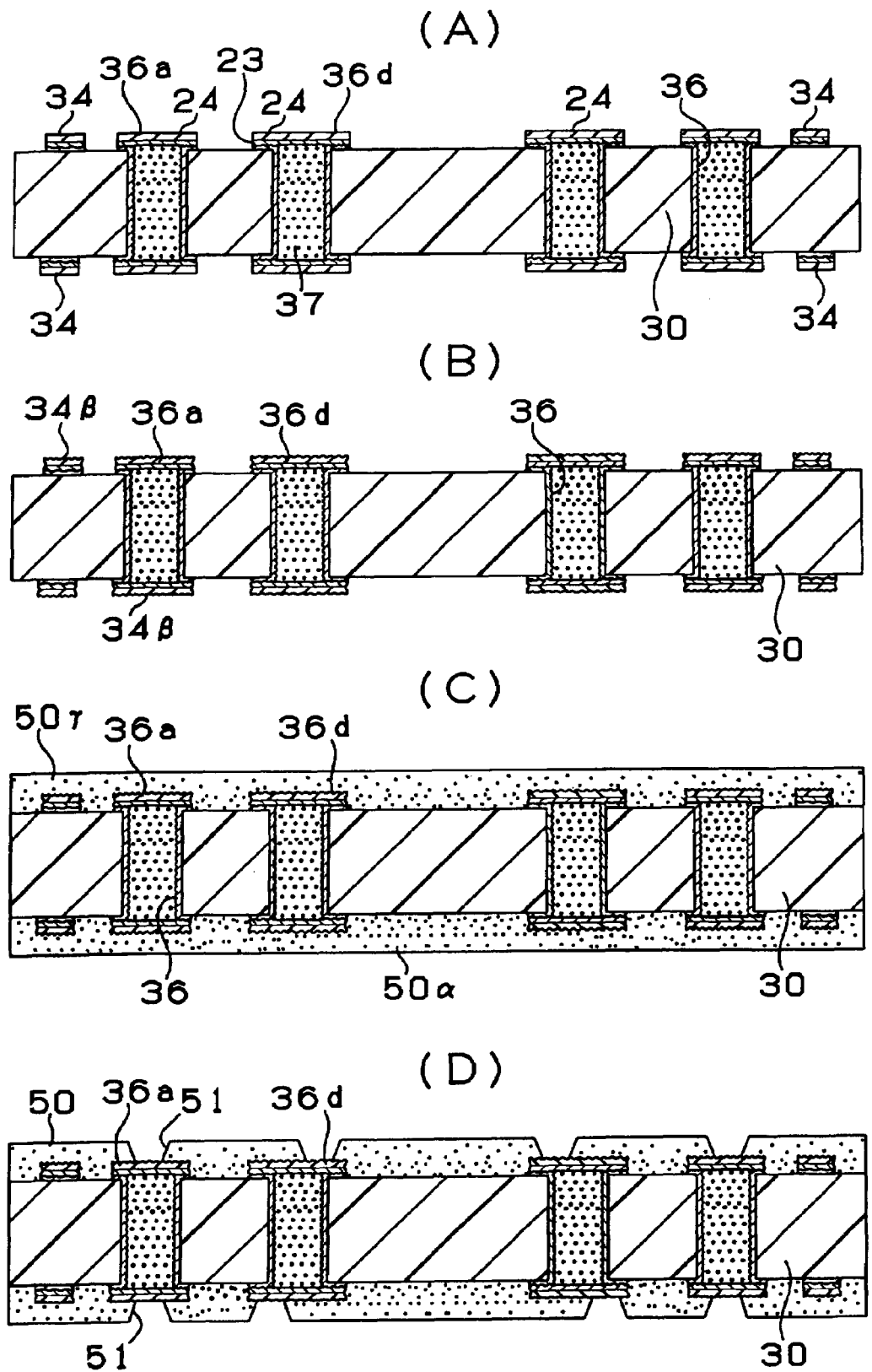
FIGS. 3(A)-3(D) are cross-sectional views of the multi-layer printed wiring board during the manufacturing process.

(7) FIG. 3 (A) shows the core substrate 30 where the electroless plating film 23, electrolytic plating film 24 and metal film 32 are removed from the sections where no etching resist 25 has been formed in FIG. 2(E). For the removal, an etching solution mainly containing cupric chloride (CuCl$_2$) may be used. Then, the etching resist 25 is removed with, for example, 5% KOH to form independent conductor circuit 34 and cover plated layers (36*a*) and (36*d*) covering the filler 37. This method is referred to as a tenting method.

(8) As shown in FIG. 3(B), the entire exposed surface of the conductor circuit 34 and the cover plated layers (36*a*) and (36*d*) including their side surfaces is roughened to form a coarse layer (textured layer) (34β). The coarse layer (34β) may be a layer of 2.5 μm in thickness made of an Cu—Ni—P alloy. Then, on the surface of the coarse layer (34β), a Sn layer having a thickness of 0.3 μm is formed (not shown).

(9) In the process of FIG. 3 (C), the interlayer resin insulation layers 50 are formed on the core substrate 30. For instance, the interlayer insulation layers 50 may be formed by the following method: a resin film (50γ) (made by Ajinomoto Co., Inc.; brand name, ABF-45SH), which is slightly larger than the core substrate 30, is placed on the front and rear surfaces of the core substrate 30; the resin film (50γ) is preliminarily attached to the core substrate 30 under the conditions of 0.45 MPa (pressure), 80° C. (temperature), and 10 seconds (pressure bond time) and then sheared; and the resin film (50γ) is completely attached by using a vacuum laminator under the conditions of 67 Pa (degree of vacuum), 0.47 MPa (pressure), 85° C. (temperature), and 60 seconds (pressure bond time), followed by thermosetting for 40 minutes at 170° C.

(10) As illustrated in FIG. 3(D), openings 51 for the first vias (60A), (60B) are formed in the first interlayer insulation layers 50. The openings 51 may be formed by using CO$_2$ gas laser (wavelength: 10.4 μm) under the conditions of 4.0 mm (beam radius), a top hat mode, 3~30 μsec (pulse width), 1.0~5.0 mm (radius of the open hole of a mask), and 1~3 shots. The abovementioned laser conditions are adjusted in such a way that the bottom radius of the first vias (60A), (60B) on the cover plated layers (36*a*), (36*d*) became 22.5 μm. Also, the position of the first via was adjusted by reading an alignment mark used for laser machining and processing it following the alignment standard or after proper correction. In this embodiment, the outer circumference of the bottom of the first via (60A), (60B) contacted a circle having a radius ((R)+(r)/3) from the center of gravity of the throughhole opening 16, and the bottom of the first via (60A) or (60B) stayed inside the circle.

(11) In the next step of FIG. 4(A), the entire exposed surface of the first interlayer insulation layer 50 including the inner walls of the openings 51 is roughened to form a coarse surface (50α). The coarse surface (50α) may be formed as follows: the core substrate 30 in which the openings 51 have been formed is immersed in a solution containing 60 g/L of permanganic acid for ten minutes at 80° C. to remove epoxy resin particles remaining on the surface of the first interlayer insulation layer 50. The depth of the coarseness of the coarse surface (50α) may be 3 μm.

(12) The core substrate 30 is then immersed in a neutralizing solution, for example, the neutralizing solution made by Shipley Company L.L.C. and then washed with water. Furthermore, the nucleus of a catalyst is attached to the surface of the first interlayer insulation layer 50 and the inner walls of the openings 51 by, for example, applying a palladium catalyst to the coarse surface (50α). As an example, the core substrate may be immersed in a catalyst solution containing palladium chloride (PbCl$_2$) and stannous chloride (SnCl$_2$) in order to deposit metal palladium, thereby providing the catalyst.

(13) Then, as illustrated in FIG. 4(B), an electroless plating film 52 is formed on the entire coarse surface (50α) including the inner walls of the openings 51. One method to form the electroless plating film 52 is to immerse the core substrate 30 provided with the catalyst in an aqueous electroless copper plating solution (Thrucup PEA; manufactured by Uemura & Co. Ltd.) to form an electroless copper plating film of 0.3~3.0 μm in thickness.

[Electroless Plating Conditions]

At 34° C. (liquid temperature) for 45 minutes.

(14) FIG. 4(C) shows a plating resist 54 formed on selected portions of the electroless plating film 52. For example, the plating resist 54 may be formed as follows: a commercially available photosensitive dry film is attached onto the core substrate 30 on which the electroless plating film 52 has been formed, a mask is placed thereon, and the core substrate 30 is exposed to light (110 mJ/cm$^2$) and developed with 0.8% sodium carbonate aqueous solution to form a plating resist of 25 μm in thickness.

(15) FIG. 5(A) shows an electrolytic plating film 56 formed on the electroless plating film 52. As an example, the electrolytic plating film 56 may be formed by the following process: the substrate is washed with water at 50° C. to remove grease, washed with water at 25° C. and then with sulfuric acid, and subsequently the core substrate 30 is subjected to electrolytic plating to form an electrolytic copper plating film 56 of, for example, 15 μm in thickness on the section where the plating resist 54 has not been formed. Exemplary electrolytic plating solution and conditions are provided below.

| [Electrolytic plating solution] | |
|---|---|
| Sulfuric acid | 2.24 mol/L |
| Copper sulfate | 0.26 mol/L |
| Additive (made by Atotec Japan; brand name, Caparasid GL) | 19.5 mL/L |
| [Electrolytic plating conditions] | |
| Current density | 1 A/dm$^2$ |
| Time | 70 minutes |
| Temperature | 22 ± 2° C. |

Figure 5:
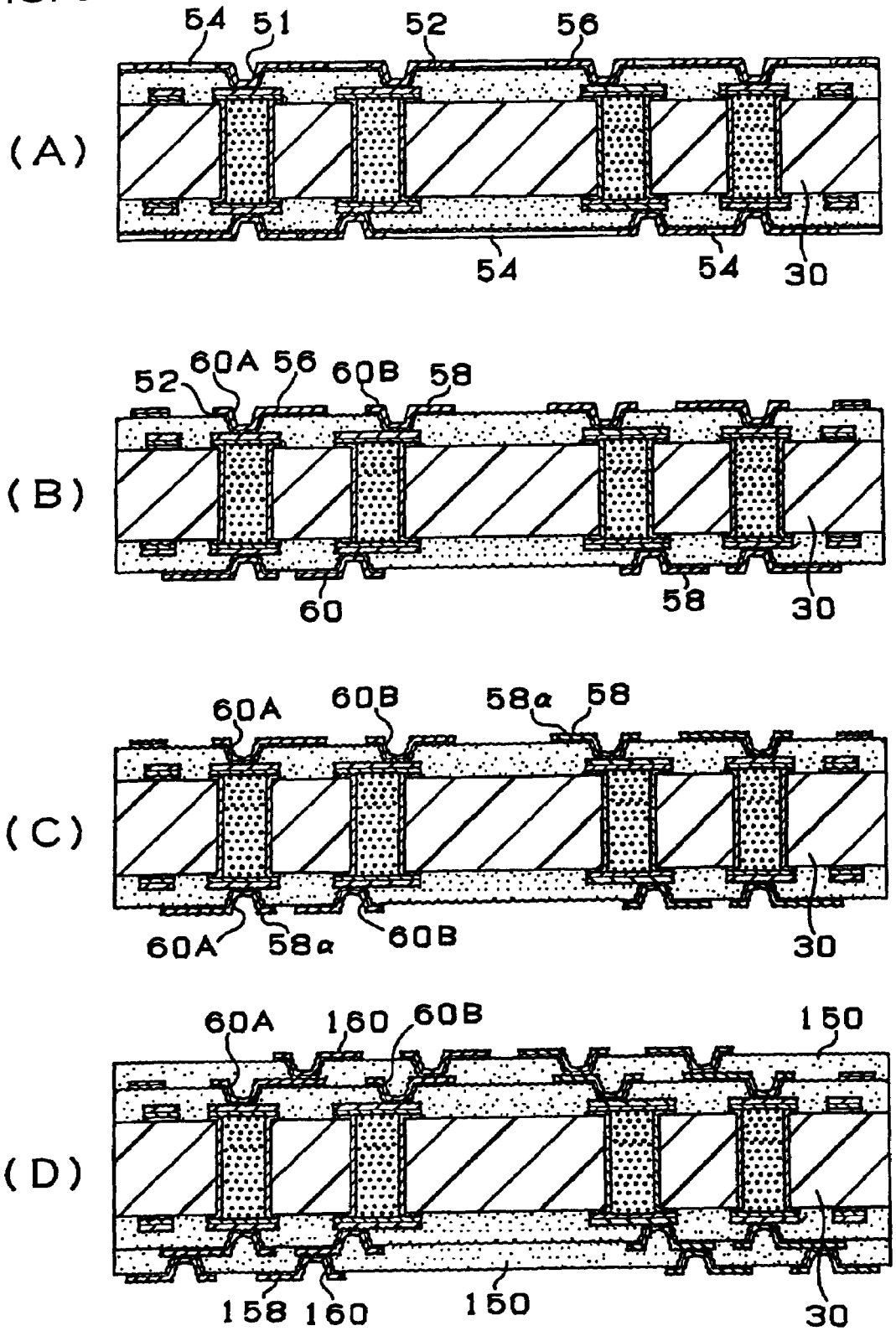
FIGS. 5(A)-5(D) are cross-sectional views of the multi-layer printed wiring board during the manufacturing process.

(16) As shown in FIG. 5 (B), the plating resist 54 and the electroless plating film 52 under the plating resist 54 are removed to form a conductor circuit 58 and first vias (60A), (60B). The removing steps may be performed as follows: after removing the plating resist 54 with 5% KOH, the electroless plating film 52 under the plating resist 54 is removed by an etching process using a mixture of sulfuric acid and hydrogen peroxide.

(17) Then, as illustrated in FIG. 5(C), the entire exposed surface of the conductor circuit 58 and first vias (60A), (60B) including side surfaces is roughened to form a coarse surface (58α). The roughening may be performed by using the same method as in the above process (4). The conductor circuit 58 is, for example, 15 μm in thickness, and the thickness may be 5~25 μm.

(18) FIG. 5(D) shows a second interlayer insulation layer 150 which is formed on the first interlayer insulation layer 50 and has a conductor circuit 158 and a second via 160. The second interlayer insulation layer 150 may be formed by repeating the above processes (9) (17). The bottom radius of the second via 160 is, for example, 25 μm.

(19) Next, as illustrated in FIG. 6(A), a resist layer 70 having openings 71 is formed on coarse surfaces of the second interlayer insulation layer 150, conductor circuit 158 and second via 160. The resist layer 70 may be formed as follows: a commercially available solder resist material is applied in the thickness of 20 μm to surfaces of the second interlayer insulation layer 150, conductor circuit 158 and second via 160, and dried for 20 minutes at 70° C. followed by 30 minutes at 70° C. After tightly attaching to the resist material a photo mask of 5 mm in thickness on which a pattern of openings of the solder resist is drawn, the resist material is exposed to ultraviolet rays (1000 mJ/cm$^2$) and then developed with DMTG solution to form openings of 200 μm in diameter. Then, the resist material is solidified by heat processes at 80° C. for one hour, at 100° C. for one hour, at 120° C. for one hour, and at 150° C. for three hours to form the resist layer 70 having a thickness of 15~25 μm and the openings 71.

(20) FIG. 6(B) shows plating layers 72, 74 formed in the openings 71. As an example, the plating layers 72, 74 may be a nickel plating layer 72, and a gold plating layer 74, respectively, formed by the following method: the substrate having the resist layer 70 is immersed in an electroless nickel plating solution (pH 4.5) containing nickel chloride ($2.3 \times 10^{-1}$ mol/L), sodium hypophosphite ($2.8 \times 10^{-1}$ mol/L), and sodium citrate ($1.6 \times 10^{-1}$ mol/L) to form the nickel plating layer 72 (5 μm in thickness) in the opening 71. Subsequently, the substrate is immersed in an electroless gold plating solution containing gold potassium cyanide ($7.6 \times 10^{-3}$ mol/L), ammonium chloride ($1.9 \times 10^{-1}$ mol/L), sodium citrate ($1.2 \times 10^{-1}$ mol/L), and sodium hypophosphite ($1.7 \times 10^{-1}$ mol/L) for 7.5 minutes at 80° C. to form the gold plating layer 74 of 0.03 μm in thickness on the nickel plating layer 72. Other than the nickel and gold layers, a single layer of Sn or precious metal (gold, silver, palladium, platinum, etc.) may be formed.

(21) Then, the multi-layer printed wiring board 10 shown in FIG. 7 is made by forming bumps (78U) and (78D) in the openings 71. These bumps (78U) and (78D) may be formed as follows: the openings 71 formed in the resist layer 70 formed on the front side of the substrate for mounting an IC chip is printed with solder paste containing Sn—Pb. After that, the openings 71 of the resist layer 70 on the other side of the substrate is printed with solder paste containing Sn—Sb. Then, solder bumps (solder bodies) are formed by reflow soldering at 200° C.

Next, as shown in FIG. 8, an IC chip 90 is mounted through the bumps (78U), and then the multi-layer printed wiring board 10 is mounted on the daughterboard 94 through the bumps (78D).

EXAMPLES 1~120 AND COMPARATIVE
EXAMPLES 1~6

Various examples of the multi-layer printed wiring board were produced based on the manufacturing method as discussed above, and the electric resistance changes after repeatedly heating and cooling the multi-layer printed wiring boards were examined. In the exemplary multi-layer printed wiring boards, variations were made in (a) the bottom radius of the first via (60A) or (60B) formed on the cover plated layer (36a) or (36d), (b) the position of the bottom portion of the first via (60A) or (60B) formed on the cover plated layer (36a) or (36d), (c) the bottom radius of the second via 160, (d) the radius of the throughhole opening 16, and (e) the throughhole pitch. In producing the multi-layer printed wiring boards of Examples 1~120 and Comparative Examples 1~6, the radius of the throughhole opening 16 was varied in the process of FIG. 1(B) by changing the radius of a drill used for forming the throughhole opening 16. The pitch was varied by inputting data on drilling position into the drill. The bottom radius of a first via on the cover-like conductor layer and a second via were altered by adjusting laser conditions as shown in the process (10). The position of the bottom of a first via on the cover-like conductor layer was decided by setting an amount of correction to an alignment mark position for a laser processing machine as shown in the process (10). An IC chip was then mounted on each multi-layer printed wiring board of Examples 1~120 and Comparative Examples 1~6. After that, sealing resin was filled in between the IC chip and the multi-layer printed wiring board to make a substrate mounted with an IC chip. The electric resistance of a specific circuit via the IC chip (electric resistance between a pair of electrodes that was electrically connected to the IC chip and exposed on the surface of the IC-mounted substrate opposite to the surface where the IC chip was mounted) was measured and set as an initial value. Then, a heat cycle test was conducted on those IC-mounted substrates for 2000 cycles (one cycle: −55 degrees for 5 minutes and 125 degrees for 5 minutes). The electric resistance was measured at the 500th, 1000th, 1500th, 1750th, and 2000th cycle of the heat cycle test to find the rate of change relative to the initial value (100×(measured value−initial value)/initial value (%)). The test results are provided in Tables 1-4. In Tables 1-4, the rate of change in the electric resistance is indicated as follows: "good" (◯) if the rate of change was ±5% or less; "normal" (Δ) if it was ±5~10%; and "poor" (×) if it exceeded ±10. The target specification was such that the rate of change was ±10% or less (i.e., "good" or "normal" in assessment) at the 1000th cycle. "Acceptable" ones were ±10% or less.

TABLE 1

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test | | | | | Second/First |
|---|---|---|---|---|---|---|---|---|---|---|---|
| | | | | | | 500 | 1000 | 1500 | 1750 | 2000 | |
| Example 1 | 50 | 150 | 15 | 17.5 | R + ⅓r | ◯ | ◯ | Δ | × | × | 1.167 |
| Example 2 | 50 | 150 | 15 | 17.5 | R + ⅙r | ◯ | ◯ | Δ | × | × | 1.167 |
| Example 3 | 50 | 150 | 15 | 17.5 | R | ◯ | ◯ | Δ | × | × | 1.167 |
| Example 4 | 50 | 150 | 15 | 17.5 | R/10 + r | ◯ | ◯ | Δ | × | × | 1.167 |
| Example 5 | 50 | 150 | 15 | 20 | R + ⅓r | ◯ | ◯ | ◯ | Δ | × | 1.333 |
| Example 6 | 50 | 150 | 15 | 20 | R + ⅙r | ◯ | ◯ | ◯ | ◯ | ◯ | 1.333 |
| Example 7 | 50 | 150 | 15 | 20 | R | ◯ | ◯ | ◯ | ◯ | ◯ | 1.333 |
| Example 8 | 50 | 150 | 15 | 20 | R/10 + r | ◯ | ◯ | ◯ | ◯ | ◯ | 1.333 |
| Example 9 | 50 | 150 | 15 | 22.5 | R + ⅓r | ◯ | ◯ | ◯ | Δ | × | 1.5 |
| Example 10 | 50 | 150 | 15 | 22.5 | R + ⅙r | ◯ | ◯ | ◯ | ◯ | ◯ | 1.5 |
| Example 11 | 50 | 150 | 15 | 22.5 | R | ◯ | ◯ | ◯ | ◯ | ◯ | 1.5 |
| Example 12 | 50 | 150 | 15 | 22.5 | R/10 + r | ◯ | ◯ | ◯ | ◯ | ◯ | 1.5 |
| Example 13 | 50 | 150 | 15 | 25 | R + ⅓r | ◯ | ◯ | ◯ | Δ | × | 1.667 |
| Example 14 | 50 | 150 | 15 | 25 | R + ⅙r | ◯ | ◯ | ◯ | ◯ | ◯ | 1.667 |
| Example 15 | 50 | 150 | 15 | 25 | R | ◯ | ◯ | ◯ | ◯ | ◯ | 1.667 |
| Example 16 | 50 | 150 | 15 | 25 | R/10 + r | ◯ | ◯ | ◯ | ◯ | ◯ | 1.667 |
| Example 17 | 50 | 150 | 15 | 30 | R + ⅓r | ◯ | ◯ | Δ | × | × | 2 |
| Example 18 | 50 | 150 | 15 | 30 | R + ⅙r | ◯ | ◯ | Δ | × | × | 2 |
| Example 19 | 50 | 150 | 15 | 30 | R | ◯ | ◯ | Δ | × | × | 2 |
| Example 20 | 50 | 150 | 15 | 30 | R/10 + r | ◯ | ◯ | Δ | × | × | 2 |
| Example 21 | 50 | 150 | 15 | 32.5 | R + ⅓r | ◯ | ◯ | Δ | × | × | 2.167 |
| Example 22 | 50 | 150 | 15 | 32.5 | R + ⅙r | ◯ | ◯ | Δ | × | × | 2.167 |
| Example 23 | 50 | 150 | 15 | 32.5 | R | ◯ | ◯ | Δ | × | × | 2.167 |
| Example 24 | 50 | 150 | 15 | 32.5 | R/10 + r | ◯ | ◯ | Δ | × | × | 2.167 |
| Example 25 | 50 | 150 | 22.5 | 25 | R + ⅓r | ◯ | ◯ | Δ | × | × | 1.111 |
| Example 26 | 50 | 150 | 22.5 | 25 | R + ⅙r | ◯ | ◯ | Δ | × | × | 1.111 |
| Example 27 | 50 | 150 | 22.5 | 25 | R | ◯ | ◯ | Δ | × | × | 1.111 |
| Example 28 | 50 | 150 | 22.5 | 25 | R/10 + r | ◯ | ◯ | Δ | × | × | 1.111 |
| Example 29 | 50 | 150 | 22.5 | 30 | R + ⅓r | ◯ | ◯ | ◯ | Δ | × | 1.333 |
| Example 30 | 50 | 150 | 22.5 | 30 | R + ⅙r | ◯ | ◯ | ◯ | ◯ | ◯ | 1.333 |
| Example 31 | 50 | 150 | 22.5 | 30 | R | ◯ | ◯ | ◯ | ◯ | ◯ | 1.333 |
| Example 32 | 50 | 150 | 22.5 | 30 | R/10 + r | ◯ | ◯ | ◯ | ◯ | ◯ | 1.333 |

TABLE 2

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test | | | | | Second/First |
|---|---|---|---|---|---|---|---|---|---|---|---|
| | | | | | | 500 | 1000 | 1500 | 1750 | 2000 | |
| Example 33 | 50 | 150 | 22.5 | 32.5 | R + ⅓r | ◯ | ◯ | ◯ | Δ | × | 1.444 |
| Example 34 | 50 | 150 | 22.5 | 32.5 | R + ⅙r | ◯ | ◯ | ◯ | ◯ | ◯ | 1.444 |
| Example 35 | 50 | 150 | 22.5 | 32.5 | R | ◯ | ◯ | ◯ | ◯ | ◯ | 1.444 |
| Example 36 | 50 | 150 | 22.5 | 32.5 | R/10 + r | ◯ | ◯ | ◯ | ◯ | ◯ | 1.444 |
| Example 37 | 50 | 150 | 32.5 | 35 | R + ⅓r | ◯ | ◯ | Δ | × | × | 1.077 |

TABLE 2-continued

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test 500 | 1000 | 1500 | 1750 | 2000 | Second/First |
|---|---|---|---|---|---|---|---|---|---|---|---|
| Example 38 | 50 | 150 | 32.5 | 35 | R + ⅓r | ○ | ○ | Δ | X | X | 1.077 |
| Example 39 | 50 | 150 | 32.5 | 35 | R | ○ | ○ | Δ | X | X | 1.077 |
| Example 40 | 50 | 150 | 32.5 | 35 | R/10 + r | ○ | ○ | Δ | X | X | 1.077 |
| Example 41 | 100 | 192.5 | 15 | 17.5 | R + ⅓r | ○ | ○ | Δ | X | X | 1.167 |
| Example 42 | 100 | 192.5 | 15 | 17.5 | R + ⅙r | ○ | ○ | Δ | X | X | 1.167 |
| Example 43 | 100 | 192.5 | 15 | 17.5 | R | ○ | ○ | Δ | X | X | 1.167 |
| Example 44 | 100 | 192.5 | 15 | 17.5 | R/10 + r | ○ | ○ | Δ | X | X | 1.167 |
| Example 45 | 100 | 192.5 | 15 | 20 | R + ⅓r | ○ | ○ | ○ | Δ | X | 1.333 |
| Example 46 | 100 | 192.5 | 15 | 20 | R + ⅙r | ○ | ○ | ○ | ○ | ○ | 1.333 |
| Example 47 | 100 | 192.5 | 15 | 20 | R | ○ | ○ | ○ | ○ | ○ | 1.333 |
| Example 48 | 100 | 192.5 | 15 | 20 | R/10 + r | ○ | ○ | ○ | ○ | ○ | 1.333 |
| Example 49 | 100 | 192.5 | 15 | 22.5 | R + ⅓r | ○ | ○ | ○ | Δ | X | 1.5 |
| Example 50 | 100 | 192.5 | 15 | 22.5 | R + ⅙r | ○ | ○ | ○ | ○ | ○ | 1.5 |
| Example 51 | 100 | 192.5 | 15 | 22.5 | R | ○ | ○ | ○ | ○ | ○ | 1.5 |
| Example 52 | 100 | 192.5 | 15 | 22.5 | R/10 + r | ○ | ○ | ○ | ○ | ○ | 1.5 |
| Example 53 | 100 | 192.5 | 15 | 25 | R + ⅓r | ○ | ○ | ○ | Δ | X | 1.667 |
| Example 54 | 100 | 192.5 | 15 | 25 | R + ⅙r | ○ | ○ | ○ | ○ | ○ | 1.667 |
| Example 55 | 100 | 192.5 | 15 | 25 | R | ○ | ○ | ○ | ○ | ○ | 1.667 |
| Example 56 | 100 | 192.5 | 15 | 25 | R/10 + r | ○ | ○ | ○ | ○ | ○ | 1.667 |
| Example 57 | 100 | 192.5 | 15 | 30 | R + ⅓r | ○ | ○ | Δ | X | X | 2 |
| Example 58 | 100 | 192.5 | 15 | 30 | R + ⅙r | ○ | ○ | Δ | X | X | 2 |
| Example 59 | 100 | 192.5 | 15 | 30 | R | ○ | ○ | Δ | X | X | 2 |
| Example 60 | 100 | 192.5 | 15 | 30 | R/10 + r | ○ | ○ | Δ | X | X | 2 |
| Example 61 | 100 | 192.5 | 15 | 32.5 | R + ⅓r | ○ | ○ | Δ | X | X | 2.167 |
| Example 62 | 100 | 192.5 | 15 | 32.5 | R + ⅙r | ○ | ○ | Δ | X | X | 2.167 |
| Example 63 | 100 | 192.5 | 15 | 32.5 | R | ○ | ○ | Δ | X | X | 2.167 |
| Example 64 | 100 | 192.5 | 15 | 32.5 | R/10 + r | ○ | ○ | Δ | X | X | 2.167 |

TABLE 3

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test 500 | 1000 | 1500 | 1750 | 2000 | Second/First |
|---|---|---|---|---|---|---|---|---|---|---|---|
| Example 65 | 100 | 192.5 | 22.5 | 25 | R + ⅓r | ○ | ○ | Δ | X | X | 1.111 |
| Example 66 | 100 | 192.5 | 22.5 | 25 | R + ⅙r | ○ | ○ | Δ | X | X | 1.111 |
| Example 67 | 100 | 192.5 | 22.5 | 25 | R | ○ | ○ | Δ | X | X | 1.111 |
| Example 68 | 100 | 192.5 | 22.5 | 25 | R/10 + r | ○ | ○ | Δ | X | X | 1.111 |
| Example 69 | 100 | 192.5 | 22.5 | 30 | R + ⅓r | ○ | ○ | ○ | Δ | X | 1.333 |
| Example 70 | 100 | 192.5 | 22.5 | 30 | R + ⅙r | ○ | ○ | ○ | ○ | ○ | 1.333 |
| Example 71 | 100 | 192.5 | 22.5 | 30 | R | ○ | ○ | ○ | ○ | ○ | 1.333 |
| Example 72 | 100 | 192.5 | 22.5 | 30 | R/10 + r | ○ | ○ | ○ | ○ | ○ | 1.333 |
| Example 73 | 100 | 192.5 | 22.5 | 32.5 | R + ⅓r | ○ | ○ | ○ | Δ | X | 1.444 |
| Example 74 | 100 | 192.5 | 22.5 | 32.5 | R + ⅙r | ○ | ○ | ○ | ○ | ○ | 1.444 |
| Example 75 | 100 | 192.5 | 22.5 | 32.5 | R | ○ | ○ | ○ | ○ | ○ | 1.444 |
| Example 76 | 100 | 192.5 | 22.5 | 32.5 | R/10 + r | ○ | ○ | ○ | ○ | ○ | 1.444 |
| Example 77 | 100 | 192.5 | 32.5 | 35 | R + ⅓r | ○ | ○ | Δ | X | X | 1.077 |
| Example 78 | 100 | 192.5 | 32.5 | 35 | R + ⅙r | ○ | ○ | Δ | Δ | X | 1.077 |
| Example 79 | 100 | 192.5 | 32.5 | 35 | R | ○ | ○ | Δ | X | X | 1.077 |
| Example 80 | 100 | 192.5 | 32.5 | 35 | R/10 + r | ○ | ○ | Δ | X | X | 1.077 |
| Example 81 | 125 | 225 | 15 | 17.5 | R + ⅓r | ○ | ○ | Δ | X | X | 1.167 |
| Example 82 | 125 | 225 | 15 | 17.5 | R + ⅙r | ○ | ○ | Δ | X | X | 1.167 |
| Example 83 | 125 | 225 | 15 | 17.5 | R | ○ | ○ | Δ | X | X | 1.167 |
| Example 84 | 125 | 225 | 15 | 17.5 | R/10 + r | ○ | ○ | Δ | X | X | 1.167 |
| Example 85 | 125 | 225 | 15 | 20 | R + ⅓r | ○ | ○ | ○ | Δ | X | 1.333 |
| Example 86 | 125 | 225 | 15 | 20 | R + ⅙r | ○ | ○ | ○ | ○ | ○ | 1.333 |
| Example 87 | 125 | 225 | 15 | 20 | R | ○ | ○ | ○ | ○ | ○ | 1.333 |
| Example 88 | 125 | 225 | 15 | 20 | R/10 + r | ○ | ○ | ○ | ○ | ○ | 1.333 |
| Example 89 | 125 | 225 | 15 | 22.5 | R + ⅓r | ○ | ○ | ○ | Δ | X | 1.5 |
| Example 90 | 125 | 225 | 15 | 22.5 | R + ⅙r | ○ | ○ | ○ | ○ | ○ | 1.5 |
| Example 91 | 125 | 225 | 15 | 22.5 | R | ○ | ○ | ○ | ○ | ○ | 1.5 |
| Example 92 | 125 | 225 | 15 | 22.5 | R/10 + r | ○ | ○ | ○ | ○ | ○ | 1.5 |

TABLE 3-continued

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test 500 | 1000 | 1500 | 1750 | 2000 | Second/First |
|---|---|---|---|---|---|---|---|---|---|---|---|
| Example 93 | 125 | 225 | 15 | 25 | R + ⅓r | ○ | ○ | ○ | Δ | X | 1.667 |
| Example 94 | 125 | 225 | 15 | 25 | R + ⅙r | ○ | ○ | ○ | ○ | ○ | 1.667 |
| Example 95 | 125 | 225 | 15 | 25 | R | ○ | ○ | ○ | ○ | ○ | 1.667 |
| Example 96 | 125 | 225 | 15 | 25 | R/10 + r | ○ | ○ | ○ | ○ | ○ | 1.667 |

TABLE 4

| # | Radius of throughhole opening R (um) | Throughhole pitch | Radius of first via on cover plated layer (first radius) r (um) | Radius of second via (second radius) (um) | Outer circumference position of bottom of first via on cover plated layer farthest from center of gravity of throughhole opening | Result of heat cycle test 500 | 1000 | 1500 | 1750 | 2000 | Second/First |
|---|---|---|---|---|---|---|---|---|---|---|---|
| Example 97 | 125 | 225 | 15 | 30 | R + ⅓r | ○ | ○ | Δ | X | X | 2 |
| Example 98 | 125 | 225 | 15 | 30 | R + ⅙r | ○ | ○ | Δ | X | X | 2 |
| Example 99 | 125 | 225 | 15 | 30 | R | ○ | ○ | Δ | X | X | 2 |
| Example 100 | 125 | 225 | 15 | 30 | R/10 + r | ○ | ○ | Δ | X | X | 2 |
| Example 101 | 125 | 225 | 15 | 32.5 | R + ⅓r | ○ | ○ | Δ | X | X | 2.167 |
| Example 102 | 125 | 225 | 15 | 32.5 | R + ⅙r | ○ | ○ | Δ | X | X | 2.167 |
| Example 103 | 125 | 225 | 15 | 32.5 | R | ○ | ○ | Δ | X | X | 2.167 |
| Example 104 | 125 | 225 | 15 | 32.5 | R/10 + r | ○ | ○ | Δ | X | X | 2.167 |
| Example 105 | 125 | 225 | 22.5 | 25 | R + ⅓r | ○ | ○ | Δ | X | X | 1.111 |
| Example 106 | 125 | 225 | 22.5 | 25 | R + ⅙r | ○ | ○ | Δ | X | X | 1.111 |
| Example 107 | 125 | 225 | 22.5 | 25 | R | ○ | ○ | Δ | X | X | 1.111 |
| Example 108 | 125 | 225 | 22.5 | 25 | R/10 + r | ○ | ○ | Δ | X | X | 1.111 |
| Example 109 | 125 | 225 | 22.5 | 30 | R + ⅓r | ○ | ○ | ○ | Δ | X | 1.333 |
| Example 110 | 125 | 225 | 22.5 | 30 | R + ⅙r | ○ | ○ | ○ | ○ | ○ | 1.333 |
| Example 111 | 125 | 225 | 22.5 | 30 | R | ○ | ○ | ○ | ○ | ○ | 11.333 |
| Example 112 | 125 | 225 | 22.5 | 30 | R/10 + r | ○ | ○ | ○ | ○ | ○ | 11.333 |
| Example 113 | 125 | 225 | 22.5 | 32.5 | R + ⅓r | ○ | ○ | ○ | Δ | X | 1.444 |
| Example 114 | 125 | 225 | 22.5 | 32.5 | R + ⅙r | ○ | ○ | ○ | ○ | ○ | 1.444 |
| Example 115 | 125 | 225 | 22.5 | 32.5 | R | ○ | ○ | ○ | ○ | ○ | 1.444 |
| Example 116 | 125 | 225 | 22.5 | 32.5 | R/10 + r | ○ | ○ | ○ | ○ | ○ | 1.444 |
| Example 117 | 125 | 225 | 32.5 | 35 | R + ⅓r | ○ | ○ | Δ | X | X | 1.077 |
| Example 118 | 125 | 225 | 32.5 | 35 | R + ⅙r | ○ | ○ | Δ | X | X | 1.077 |
| Example 119 | 125 | 225 | 32.5 | 35 | R | ○ | ○ | Δ | X | X | 1.077 |
| Example 120 | 125 | 225 | 32.5 | 35 | R/10 + r | ○ | ○ | Δ | X | X | 1.077 |
| Comparative 1 | 50 | 150 | 17.5 | 17.5 | R/10 + r | Δ | X | X | X | X | 1 |
| Comparative 2 | 50 | 150 | 35 | 35 | R/10 + r | Δ | X | X | X | X | 1 |
| Comparative 3 | 100 | 192.5 | 17.5 | 17.5 | R/10 + r | Δ | X | X | X | X | 1 |
| Comparative 4 | 100 | 192.5 | 35 | 35 | R/10 + r | Δ | X | X | X | X | 1 |
| Comparative 5 | 125 | 225 | 17.5 | 17.5 | R/10 + r | ○ | Δ | X | X | X | 1 |
| Comparative 6 | 125 | 225 | 35 | 35 | R/10 + r | ○ | Δ | X | X | X | 1 |

In Examples 1~120, the bottom of a first via formed on the cover-like conductor layer was placed inside a circle having a radius ((R)+(r)/3) from the center of gravity of a throughhole opening, and the bottom radius of the first via on the cover-like conductor layer (hereinafter "the first radius") was made smaller than the bottom radius of a second via formed in the second interlayer insulation layer (hereinafter "the second radius") where (R) is the radius of a throughhole opening, and (r) is the bottom radius of a first via on the cover-like conductor layer. Examples 1~120 met at least the target specification and were acceptable even at the 1500th cycle. In Comparative Examples 1~6, the bottom of a first via formed on the cover-like conductor layer was also placed inside a circle having a radius ((R)+(r)/3) from the gravity center of a throughhole opening, but the bottom radius of the first via on the cover-like conductor layer was made equal to the second radius. Comparative Examples 1~6 were "normal" or "poor" at the cycle of the target specification, and all of them were "poor" at the 1500th cycle. In Comparative Examples 1~6, the bonding between the cover-like conductor layer and a first via on the cover-like conductor layer became strong with respect to stress because the first radius and the second radius were equal. This is believed to be because the stress between the cover-like conductor layer and a first via on the cover-like conductor layer was smaller. As a result, it became more difficult for the first via on the cover-like conductor layer and insulation layers around it to deform so as to reduce the stress. Therefore, it is believed that the stress during heating and cooling cycles was concentrated on the bottom of a second via hole and the conductor layer (land) 58 on the lower layer, which weakened the bonding between the bottom of the second via and the land and resulted in a rise of connection resistance.

The comparison between Comparative Examples 1~4 and Comparative Examples 5 and 6 shows that the target specification was satisfied when the radius of the throughhole opening and the throughhole pitch were low in density even if the first radius was equal to the second radius. However, the results were poor at the 1000th cycle if the radius of a throughhole opening was 100 μm or less and the throughhole pitch was 385 μm or less. It is speculated that this was because the latter had stronger stress. One speculated reason is that deformation of the multi-layer printed wiring board was larger in Comparative Examples 5 and 6, because a throughhole conductor (copper: 16 ppm) that had a thermal expansion coefficient different from that of the insulative core substrate (thermal expansion coefficient: 50~60 ppm) was furnished on the core substrate in high density. Therefore, it is advantageous to apply the present embodiment to multi-layer printed wiring boards whose throughhole opening is 100 μm or less in radius and pitch is 385 μm or less.

According to the results of Examples 1~120 at the 1500th and 1750th cycles, it was found that the radius of a second via with respect to the radius of a first via was preferably 1.3~1.7. It is speculated that this was because the bonding power/stress became substantially equal in this range because of the difference of stress between both sections, even if the bonding force (adhesive force per unit area x bonding area) between the cover-like conductor layer and the bottom of a first via on the cover-like conductor layer was weaker than the bonding force between a second via and the conductor layer (land) 58 on the lower layer. (If there is any difference between them, stress is concentrated on the weak side, resulting in problems including detachment.)

Furthermore, from the results of the 1750th and 2000th cycles, it was found that the bottom of a first via on the cover-like conductor layer is preferably positioned inside a circle having a radius of $((R)+(r)/6)$. As the bottom of a first via on the cover-like conductor layer has more portions outside of the $((R)+(r)/6)$ circle and inside of the $((R)+(r)/3)$ circle, more portions are positioned above the insulative substrate. It is therefore considered that deformation occurs under the influence of physical properties (Young's modulus, Poisson ratio, thermal expansion coefficient, and the like) of both of the throughhole and insulative substrate and complicated behavior results, which leads to the transmission of more stress to a second via hole.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A multi-layer printed wiring board comprising:
    a core substrate having a throughhole opening;
    a throughhole structure formed in the throughhole opening;
    a first interlayer insulation layer formed over the core substrate;
    a first via formed in the first interlayer insulation layer and having a bottom portion having a first radius;
    a second interlayer insulation layer formed over the first interlayer insulation layer and the first via; and
    a second via formed in the second interlayer insulation layer and having a bottom portion having a second radius greater than the first radius,
    wherein the first via is positioned inside a circle having a radius D1 from a gravity center of the throughhole opening, and the radius D1 of the circle satisfies a formula:

$$(D1)=(R)+(r)/3,$$

where R represents a radius of the throughhole opening and r represents the first radius of the first via.

2. The multi-layer printed wiring board according to claim 1, wherein a ratio of the second radius with respect to the first radius is in a range between 1.3 and 1.7.

3. The multi-layer printed wiring board according to claim 1, wherein the first via is formed inside a circle having a radius D2 from the gravity center of the throughhole opening, where the radius D2 of the circle satisfies a formula:

$$(D2)=(R)+(r)/6.$$

4. The multi-layer printed wiring board according to claim 1, further comprising a cover plated layer formed over the core substrate and covering the throughhole opening, wherein the cover plated layer is formed under the first via.

5. The multi-layer printed wiring board according to claim 4, wherein the cover plated layer has a substantially circular portion covering the throughhole opening.

6. The multi-layer printed wiring board according to claim 5, wherein the first via is positioned within the substantially circular portion of the cover plated layer.

7. The multi-layer printed wiring board according to claim 4, wherein the cover plated layer has a first semicircular portion and a second semicircular portion joined together, and the first via is formed over the first semicircular portion.

8. The multi-layer printed wiring board according to claim 1, wherein the throughhole structure has a sidewall conductor layer formed in the throughhole opening, and the first via is positioned inside an area under which the sidewall conductor layer is formed.

9. The multi-layer printed wiring board according to claim 1, wherein the throughhole structure has a sidewall conductor layer formed in the throughhole opening, and the first via is formed over an area under which the sidewall conductor layer is formed.

10. The multi-layer printed wiring board according to claim 1, wherein the throughhole structure has a sidewall conductor layer formed in the throughhole opening and comprises a conductive material, and the throughhole structure is filled with the conductive material.

11. The multi-layer printed wiring board according to claim 1, wherein the throughhole opening has the radius of 100 μm or less.

12. The multi-layer printed wiring board according to claim 1, further comprising a second throughhole opening formed in the core substrate, wherein the first and second throughhole openings are formed at a pitch of 385 μm or less.

13. A method of manufacturing a multi-layer printed wiring board, comprising:
    forming a throughhole opening in a core substrate;
    forming a throughhole structure in the throughhole opening;

forming a first interlayer insulation layer over the core substrate;

forming a first via in the first interlayer insulation layer, the first via having a bottom portion having a first radius;

forming a second interlayer insulation layer over the first interlayer insulation layer; and forming a second via in the second interlayer insulation layer, the second via having a bottom portion having a second radius greater than the first radius, wherein the first via is formed inside a circle having a radius D1 from a gravity center of the throughhole opening, and the radius D1 of the circle satisfies a formula:

$$(D1)=(R)+(r)/3$$

where R represents a radius of the throughhole opening and r represents the first radius of the first via.

14. The method according to claim 13, wherein the second via is formed such that a ratio of the second radius with respect to the first radius is in a range between 1.3 and 1.7.

15. The method according to claim 13, wherein the first via is formed inside a circle having a radius D2 from the gravity center of the throughhole opening, and the radius D2 of the circle satisfies a formula:

$$(D2)=(R)+(r)/6.$$

16. The method according to claim 13, further comprising forming a cover plated layer over the core substrate covering the throughhole opening, wherein the first via is formed over the cover plated layer.

17. The method according to claim 16, wherein the forming of the cover plated layer comprises forming a substantially circular portion covering the throughhole opening.

18. The method according to claim 17, wherein the forming of the first via comprises forming the first via within the substantially circular portion of the cover plated layer.

19. The method according to claim 16, wherein the forming of the cover plated layer comprises forming a first semicircular portion and a second semicircular portion joined together, and the forming of the first via comprises forming the first via over the first semicircular portion.

20. The method according to claim 13, wherein the forming of the throughhole structure comprises forming a sidewall conductor layer in the throughhole opening of the core substrate, and the forming of the first via comprises forming the first via inside an area under which the sidewall conductor layer is formed.

21. The method according to claim 13, wherein the forming of the throughhole structure comprises forming a sidewall conductor layer in the throughhole opening of the core substrate, and the forming of the first via comprises forming the first via over an area under which the sidewall conductor layer is formed.

22. The method according to claim 13, wherein the forming of the throughhole structure comprises forming a sidewall conductor layer comprising a conductive material in the throughhole opening of the core substrate, and filling the throughhole structure with the conductive material.

23. The method according to claim 13, wherein the forming of the throughhole opening comprises forming a throughhole opening having the radius of 100 μm or less.

24. The method according to claim 13, further comprising a second throughhole opening in the core substrate, wherein the first and second throughole openings are formed at a pitch of 385 μm or less.

* * * * *

UNITED STATES PATENT AND TRADEMARK OFFICE
CERTIFICATE OF CORRECTION

| | |
|---|---|
| PATENT NO. | : 7,402,760 B2 |
| APPLICATION NO. | : 11/832892 |
| DATED | : July 22, 2008 |
| INVENTOR(S) | : Wu |

Page 1 of 1

It is certified that error appears in the above-identified patent and that said Letters Patent is hereby corrected as shown below:

On the title page, Item (30), the Foreign Application Priority Data is missing. Item (30) should read:

-- (30)            Foreign Application Priority Data

February 2, 2005      (JP) ................................... 2005-026896 --

Signed and Sealed this

Sixteenth Day of September, 2008

JON W. DUDAS
*Director of the United States Patent and Trademark Office*